(12) United States Patent
Wimplinger et al.

(10) Patent No.: US 12,135,500 B2
(45) Date of Patent: Nov. 5, 2024

(54) STAMP AND METHOD FOR EMBOSSING

(71) Applicant: EV Group E. Thallner GmbH, St. Florian am Inn (AT)

(72) Inventors: Markus Wimplinger, Reid am Innkreis (AT); Gerald Mittendorfer, Stuben (AT)

(73) Assignee: EV Group E. Thallner GmbH, St. Florian am Inn (AT)

( * ) Notice: Subject to any disclaimer, the term of this patent is extended or adjusted under 35 U.S.C. 154(b) by 347 days.

(21) Appl. No.: 17/051,312

(22) PCT Filed: May 4, 2018

(86) PCT No.: PCT/EP2018/061584
§ 371 (c)(1),
(2) Date: Oct. 28, 2020

(87) PCT Pub. No.: WO2019/210976
PCT Pub. Date: Nov. 7, 2019

(65) Prior Publication Data
US 2021/0240075 A1  Aug. 5, 2021

(51) Int. Cl.
*G03F 7/00* (2006.01)
*B29C 59/00* (2006.01)
*B29C 59/02* (2006.01)

(52) U.S. Cl.
CPC .......... *G03F 7/0002* (2013.01); *B29C 59/002* (2013.01); *B29C 59/022* (2013.01); *B29C 59/026* (2013.01); *G03F 7/70875* (2013.01); *B29C 2059/023* (2013.01)

(58) Field of Classification Search
CPC .. G03F 7/0002; G03F 7/0017; G03F 7/70875; H01L 21/0271; H01L 2251/105; B29C 59/002; B29C 59/022; B29C 59/026; B29C 2059/023
See application file for complete search history.

(56) References Cited

U.S. PATENT DOCUMENTS

| | | | |
|---|---|---|---|
| 7,704,425 B2 | 4/2010 | Heidari et al. | |
| 7,879,204 B2* | 2/2011 | Funahashi | C23F 13/06 |
| | | | 204/196.18 |
| 10,118,381 B2 | 11/2018 | Kreindl | |
| 2003/0234470 A1 | 12/2003 | Haan et al. | |
| 2004/0036201 A1 | 2/2004 | Chou et al. | |
| 2005/0238967 A1* | 10/2005 | Rogers | C04B 24/383 |
| | | | 430/5 |

(Continued)

FOREIGN PATENT DOCUMENTS

| | | |
|---|---|---|
| CN | 102275445 A | 12/2011 |
| EP | 2942667 A2 | 11/2015 |

(Continued)

OTHER PUBLICATIONS

Japanese Office Action issued in related Japanese Patent Application No. 2020-558433 dated Mar. 16, 2022 along with the English-language machine translation.

(Continued)

*Primary Examiner* — Alison L Hindenlang
*Assistant Examiner* — Erica Hartsell Funk
(74) *Attorney, Agent, or Firm* — KUSNER & JAFFE

(57) ABSTRACT

A stamp comprised of a soft stamp and a carrier fixed to the soft stamp.

15 Claims, 2 Drawing Sheets

(56) References Cited

U.S. PATENT DOCUMENTS

| | | | | |
|---|---|---|---|---|
| 2007/0212522 | A1* | 9/2007 | Heidari | B82Y 10/00 |
| | | | | 428/141 |
| 2008/0044743 | A1 | 2/2008 | Nam et al. | |
| 2009/0298296 | A1* | 12/2009 | Burdinski | G03F 7/0002 |
| | | | | 438/758 |
| 2009/0317727 | A1* | 12/2009 | Beck | B82Y 10/00 |
| | | | | 430/326 |
| 2015/0156886 | A1* | 6/2015 | Wang | H05K 3/04 |
| | | | | 174/253 |
| 2016/0299424 | A1* | 10/2016 | Chouiki | G03F 7/0015 |
| 2017/0176853 | A1* | 6/2017 | Cheng | B29C 59/022 |
| 2017/0211044 | A1* | 7/2017 | Huebsch | C12M 21/08 |

FOREIGN PATENT DOCUMENTS

| | | |
|---|---|---|
| TW | 200705123 A | 2/2007 |
| WO | WO 2015/078520 A1 | 6/2015 |
| WO | WO 2015/161868 A1 | 10/2015 |

OTHER PUBLICATIONS

International Search Report from corresponding International Patent Application No. PCT/EP18/61584, mailed Jan. 24, 2019.
Office Action (with English translation) of Oct. 26, 2023 from related/corresponding Korean Patent Application No. 10-2020-7031405.

* cited by examiner

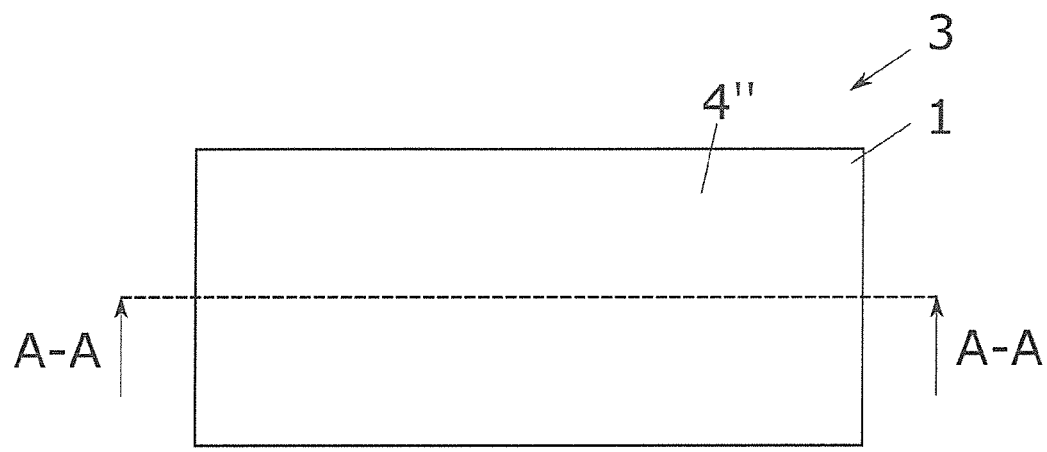
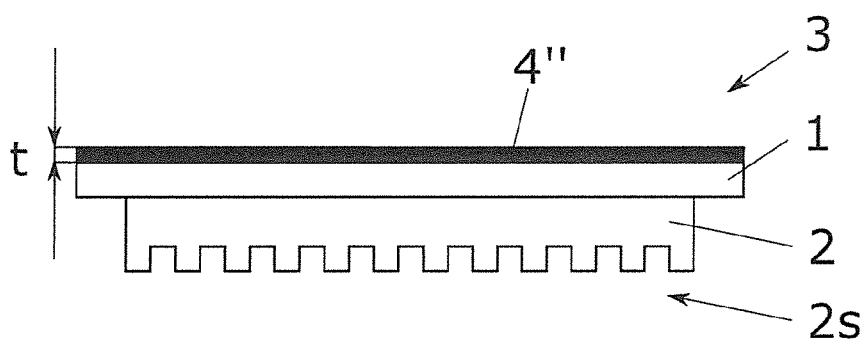
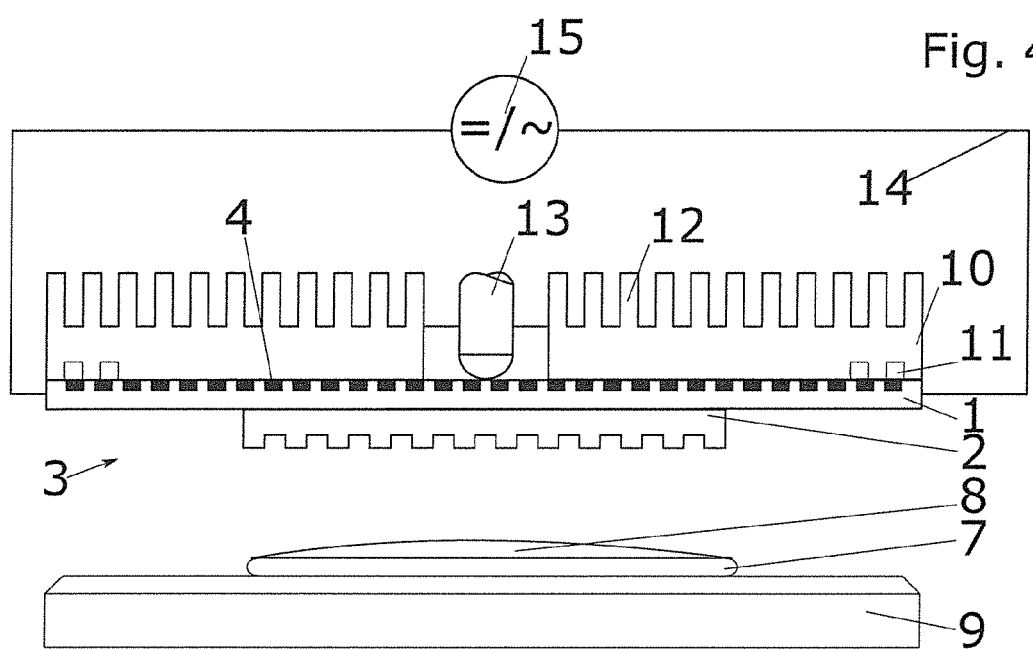

STAMP AND METHOD FOR EMBOSSING

FIELD OF THE INVENTION

The invention relates to a stamp, a use of a stamp, a device with a stamp and a method for embossing.

BACKGROUND OF THE INVENTION

In the prior art, there are two basic types of curing mechanisms for an embossing compound, which can be shaped by one of the countless embossing methods. On the one hand, the embossing compound can be cured thermally, on the other hand by means of electromagnetic radiation. Aside from this, there are in the prior art thermal embossing processes ("hot embossing"), in which embossing takes place in thermoplastic materials. In particular, the thermal curing or thermal embossing processes take place by means of devices which comprise very complex, large heating systems which can provide the required heat. These heating systems are located above and/or below the stamp or the substrate on which the embossing compound to be embossed is located.

A major problem in the prior art is the structural design of the heating systems. Most heating systems are large, bulky, unwieldy, expensive and do not produce the heat in the vicinity of the embossing compound to be cured or the embossing compound to be embossed. The generated heat has to be transported to the embossing compound via the entire stamp and/or through the sample holder and the substrate. In particular, an efficient heating contact between the heating system and the carrier on which the soft stamp is fixed is lost when the carrier and the soft stamp are curved and the heating takes place from the stamp side. The heat flow from the heating system in the direction of the embossing compound to be cured must then, insofar as the heating system itself has not been designed curved, bridge the thermal resistance between the rear side of the carrier and its heating surface.

SUMMARY OF THE INVENTION

It is an objective of the present invention to eliminate the drawbacks of the prior art.

This problem is solved with the subject-matter of the coordinated claims. Advantageous developments of the invention are stated in the sub-claims. All combinations of at least two features stated in the description, the claims and/or the figures fall within the scope of the invention. Insofar as value ranges are stated, any intermediate values should also be deemed to be disclosed as limiting values.

According to the invention, a stamp is provided, comprising a soft stamp and a carrier fixed to the soft stamp, wherein the carrier comprises at least one heating element.

The carrier and the soft stamp are preferably fixed together solely by adhesive forces, in particular by the soft stamp being embossed on the carrier. It is however also conceivable for a soft stamp to be formed and fixed with the carrier by means of fixing elements, which are located on the carrier.

According to the invention, a device is also provided, comprising a stamp according to the invention as well as a control unit, in particular a current and/or voltage source, for controlling the at least one heating element.

According to the invention, a use of a stamp according to the invention for embossing an embossing compound is also provided.

According to the invention, a method for embossing an embossing compound with a stamp according to the invention with the following steps, in particular the following sequence, is also provided:
- coating of a substrate with the embossing compound,
- alignment of the stamp relative to the substrate,
- embossing of the embossing compound by means of the stamp,
- heating of the embossing compound by means of the at least one heating element of the carrier,
- removal of the stamp from the embossing compound.

The invention is based in particular on the idea of designing the stamp for the hot embossing from two components with technically very different properties. The stamp comprises a carrier, which is directly heatable, and a structural part (the soft stamp), which is made of a soft, deformable material. The carrier is designed in such a way that it is directly heatable, i.e. the heating elements are designed directly in the solid-state structure of the carrier. The carrier is thus used not only as a mechanical structural element, but also is a heater, in particular as a thin layer heater.

The characteristic distinguishing feature between the stamp according to the invention and components of the prior art, with which a corresponding soft stamp could also make contact, is that the stamp according to the invention and therefore also the carrier are deformable and possess a correspondingly low bending resistance. Furthermore, the carrier comprises, besides its low bending resistance, the at least one heating element.

The essence of the invention includes providing a stamp, with which the heating is generated by solid-state physical processes, in particular by the generation of Joule heat, directly in the carrier of the stamp. In particular, it is a thin-layer heater. The heater is designed in particular in such a way that it has space in a carrier a few millimetres thick.

The required heat for the curing of the embossing compound is advantageously generated as close as possible to the embossing compound. A heat transport over a longer distance thus does not take place or heat losses are for the most part minimised. The stamp as a whole is considerably more compact and less costly.

The stamp according to the invention comprises a soft stamp and a carrier fixed on the soft stamp, wherein the carrier comprises at least one heating element.

A carrier, in particular a back plate (back-plane), is understood to mean a stabilising element, in particular a structural element, for the soft stamp. The carrier can in particular be a plate or a film. The carrier comprises at least one active and/or passive heater.

A soft stamp is understood to mean the embossing element, which comprises structures with the aid of which the embossing compound is embossed. The soft stamp is fixed to the carrier, in particular reversibly, i.e. detachably.

Soft stamp materials for producing the soft stamp can in particular be UV-curable materials or thermally curable materials. More generally, the curing can be carried out by electromagnetic radiation, by heat, by current, by magnetic fields and/or other methods. Soft stamps are moulded for example as a negative of a master stamp.

The E-modulus of the soft stamp material is less than 1000 GPa, preferably less than 500 GPa, more preferably less than 200 GPa, most preferably less than 100 GPa, with utmost preference less than 20 GPa.

A stamp is understood to mean the combination of a carrier and a soft stamp.

In particular, the soft structures of the soft stamp together with the bendability of the carrier with its low bending resistance and the at least one heating element enable a more reliable removal compared to the prior art.

The embossing compound (also referred to in the following as embossing material) is understood to mean a polymer, which is embossed and thus structured by the stamp, in particular the soft stamp.

The embossing material can in particular be a thermally curing material, thermally mouldable material, in particular thermoplastic material and/or a hybrid material, which can be shaped by a combination of thermal processes and irradiation with electromagnetic radiation.

A preferred embodiment for such a hybrid material is a material which has thermoplastic properties before irradiation with UV light and is then cured by irradiation with UV light. The curing process can preferably be accelerated by simultaneous heating.

A substrate is understood to mean an object on which an embossing compound is deposited, which is to be embossed by the stamp according to the invention.

Other Preferred Embodiments

Provision is preferably made such that
the carrier is fixed detachably on the soft stamp, and/or
the stamp comprises a temperature-controlled carrier holder, and/or
the at least one heating element is constituted as an, in particular meandering, strip conductor, in particular as a metallic and/or n-doped region, and/or
the at least one heating element is constituted as a coil, in particular a flat coil, and/or
the soft stamp comprises conductive nanoparticles, and/or
the at least one heating element is constituted as a conductive layer in and/or on the carrier, the carrier preferably being made at least partially, preferably entirely, of a conductive material, in particular metal, and/or
there can be generated in the carrier a current density between 0.01 A/m$^2$ and 1 MA/m$^2$, preferably between 0.1 A/m$^2$ and 1 MA/m$^2$, more preferably between 1 A/m$^2$ and 1 MA/m$^2$, still more preferably between 10 A/m$^2$ and 1 MA/m$^2$, most preferably between 100 A/m$^2$ and 1 MA/m$^2$, with utmost preference between 1000 A/m$^2$ and 1 MA/m$^2$, and/or
the carrier is constituted as a plate, wherein the thickness of the plate amounts to between 0.01 mm and 20 mm, preferably between 0.05 mm and 15 mm, more preferably between 0.1 mm and 10 mm, still more preferably between 0.5 mm and 5 mm, most preferably between 0.75 mm and 2.5 mm, with utmost preference between 1 mm and 2 mm, and/or
the carrier is constituted as a film, in particular as a film comprising an organic semiconductor, wherein the thickness of the film amounts to between 0.01 mm and 5 mm, preferably between 0.05 mm and 2.5 mm, more preferably between 0.1 mm and 2 mm, still more preferably between 0.5 mm and 1.5 mm, most preferably between 0.75 mm and 1.25 mm, with utmost preference between 1 mm and 1.25 mm.

The stamp according to the invention comprises at least a carrier and a soft stamp.

The device preferably also comprises a substrate holder, which fixes the substrate on which the embossing compound is deposited.

The device preferably also comprises a carrier holder which can be temperature-controlled, in particular cooled. The carrier holder is an important part of the device, the purpose of which includes holding and/or deforming and/or, after the heating process by the at least one heating element of the carrier, cooling the stamp according to the invention again quickly and efficiently. The carrier holder is designed in particular such that the thermal conductivity is at a maximum, or the thermal resistance is at a minimum. In the subsequent course of the disclosure, design features are specified, with the aid of which efficient temperature control, in particular cooling, of the stamp can be brought about by means of the carrier holder.

The stamp according to the invention advantageously enables, in particular in combination with the carrier holder, much more rapid heating and cooling ramps than solutions from the prior art on account of the compact structure and the reduced thermal mass associated therewith and the shorter path for the thermal conduction. A much higher throughput and therefore a significant reduction in production costs are thus achieved.

Advantageously, the possible heating rate is >40° C./min, also preferably >100° C./min, more preferably >20° C./s, still more preferably >50° C./s, most preferably >100° C./s.

The cooling rate reaches in particular >20° C./min, preferably >40° C./min, more preferably >100° C./min, still more preferably >40° C./s.

All embodiments of the heater according to the invention, which can be incorporated in the carrier, can also be incorporated in the substrate holder and/or in the carrier holder. This is of particular interest and advantage when a symmetrical heating of the embossing compound, i.e. of the upper side and of the lower side is to take place. Subsequently, for the sake of greater clarity, all the embodiments of the heater are described in conjunction with the carrier. All the features equally apply, however, to the heater in conjunction with the substrate holder and/or the carrier holder.

The carrier can in particular be produced from at least one of the following materials.

Metal, in particular
  Ca, Ag, Au, Al, Fe, Ni, Co, Pt, W, Cr, Pb, Ti, Ta, Zn, Sn
Semiconductors, in particular
  Ge, Si, alpha-Sn, fullerenes, B, Se, Te
Compound semiconductors, in particular
  GaAs, GaN, InP, InxGa1−xN, InSb, InAs, GaSb, AlN, InN, GaP, BeTe, ZnO, CuInGaSe2, ZnS, ZnSe, ZnTe, CdS, CdSe, CdTe, Hg(1−x)Cd(x)Te, BeSe, HgS, AlxGa1−xAs, GaS, GaSe, GaTe, InS, InSe, InTe, CuInSe2, CuInS2, CuInGaS2, SiC, SiGe
Polymers, in particular
  Acrylester-styrene-acrylonitrile, acrylonitrile/methylmethacrylate, acrylonitrile/butadiene/acrylate, acrylonitrile/chlorinated polyethylene/styrene, acrylonitrile-butadiene-styrene, acryl polymers, alkid resins, butadiene rubber, butyl rubber, casein plastics, synthetic horn, cellulose acetate, cellulose ether and derivatives, cellulose hydrate, cellulose nitrate, chitin, chitosan, chloroprene rubber, cyclo-olefin copolymers, uniform polyvinylchloride, epoxy resin, ethylene-ethylacrylate copolymer, ethylene polyvinyl acetate, ethylene propylene copolymer, ethylene propylene diene rubber, ethylene vinyl acetate, expandable polystyrene, fluorinated rubber, urea formaldehyde resin, urea resins, isoprene rubber, lignin, melamine formaldehyde resin, melamine resins, methylacrylate/butadiene/styrene, natural rubber, perfluoroalkoxylalkane, phenol formaldehyde resin, polyacetals, polyacrylonitrile, polyamide, polybutylene succinate, polybutylene terephthalate, polycaprolactone, polycarbonate, polycarbonates, polytrichloroytrifloro-ethylene, polyester, polyester amide, polyether alcohols, polyether-block-amide, polyether imide, polyether ketones, polyether sulphone, polyethylene, polyethylene terephthalate, polyhydroxyalkanoates, polyhydroxybutyrate, polyimide, polyisobutylene, polylactide (polylactic acid), polymethacrylmethylimide, polymethyl methacrylate, polymethyl pentene, polyoxymethylene or polyacetal, polyphenylene ether, polyphenylene sulphide, polyphthalamide, polypropylene, polypropylene copolymers, polypyrrole, polystyrene, polysulphone, polytetrafluoroethylene, polytrimethylene terephthalate, polyurethane, polyvinyl acetate, polyvinyl butyral, polyvinyl chloride (hard PVC), polyvinylchloride (soft PVC), polyvinylidene fluoride, polyvinyl pyrrolidone, styrene-acrylonitrile copolymerisate, styrene-butadiene rubber, styrene-butadiene-styrene, synthetic rubber, thermoplastic polyurethane, unsaturated polyester, vinyl acetate copolymers, vinyl chloride/ethylene/methacrylate, vinyl chloride/ethylene, vinyl chloride-vinyl acetate copolymers, plasticised polyvinylchloride Metallic glasses Non-metallic glasses, in particular Organic non-metallic glasses Inorganic non-metallic glasses, in particular Non-oxidic glasses, in particular Halide glasses Chalcogenide glasses Oxidic glasses, in particular Phosphate glasses Silicate glasses, in particular Aluminosilicate glasses Lead silicate glasses Alkali silicate glasses, in particular Alkali alkaline-earth silicate glasses Borosilicate glasses( )

Quartz glass

Borate glasses, in particular

Alkali borate glasses

Materials which are referred to as glasses but are not

Sapphire crystal.

In a preferred embodiment according to the invention, the carrier comprises a semiconductor and/or compound semiconductor material and preferably comprises at least one conductive region.

In particular, apart from the at least one heating element, other functional units can also be present in the carrier, in particular sensors, preferably temperature sensors, memories and/or microchips. In particular, a complete control device for a control loop can be produced in the carrier by the use of heating elements, sensors and/or microchips.

In this preferred embodiment according to the invention, at least one conductive region, through which current can flow, can be produced directly in the carrier by a plurality of process steps. In a first process step, an in particular photosensitive lacquer is deposited on the carrier for this purpose. In a second process step, the lacquer is structured, in particular by imprint and/or photolithographic processes. In a third process step, the lacquer is developed. In a further process step, the lacquer thus produced serves as a doping mask during a doping process, in which the semiconductor material is doped at the regions accessible to the doping elements. In a further process step, the lacquer is removed.

By means of this process described by way of example, a semiconductor carrier with at least one conductive region can be created.

In a special, preferred embodiment according to the invention, the carrier comprises a dielectric and comprises at least one conductive, in particular metallic region.

In particular, the carrier comprises a dielectric, in which at least one conductive, in particular metallic region is introduced by a plurality of different processes. In a first process step, an, in particular photosensitive, lacquer is deposited on the dielectric carrier. In a second process step, the lacquer is structured, in particular by imprint and/or photolithographic processes. In a third process step, the lacquer is developed. In a further process step, the lacquer thus produced serves as an etching mask during an etching process, in which the semiconductor material is etched at the regions accessible to the etching substance. In a further process step, the lacquer is removed. In a further process step, an electrical material is deposited on the carrier and in particular fills the edge regions. In a further process step, the coating side of the carrier is thinned until such time as the entire metal has been removed from the upper side and only the etched regions in the dielectric carrier remain filled. By means of this process described by way of example, a dielectric carrier with conductive regions can be created.

The at least one conductive region is used in particular to produce structures with the aid of which heat is generated. In particular, Joule heat is generated, i.e. power dissipation heat.

In another preferred embodiment, the carrier comprises at least one coil, in particular a flat coil. For this purpose, flat coils can be produced in the carrier. The flat coils can, insofar as high-frequency alternating current flows through them, generate heat in adjacent conductive regions, in particular by induction.

In another preferred embodiment, the soft stamp comprises conductive nanoparticles. In particular, conductive nanoparticles are present in the soft stamp, so that a high-frequency magnetic alternating field, which is generated in the carrier, heats the nanoparticles in the soft stamp.

The carrier preferably comprises conductive regions which are constituted as coils, in particular flat coils. An alternating current preferably flows through the coils, so that they generate a magnetic field changing over time. The coils are preferably directly connected to one another and are preferably distributed uniformly over the carrier, so that as high a number of magnetic field sources as possible is present. A magnetic field that is as homogeneous as possible should advantageously be produced by a high number of coils.

In another preferred embodiment, the carrier is made at least partially, preferably completely, of a conductive material, in particular metal. The heating is generated by a high current density, which is generated in the metallic carrier. The smaller the cross-sectional area of the carrier, the greater the current density. The length and width of the carrier are determined and specified by the size of the soft stamp. The thickness of the carrier can usually be freely selected, as long as the required mechanical stability of the carrier is maintained. The thickness of the carrier is therefore preferably minimal.

The current density amounts, particularly for a three-sigma confidence level of 98%, to between 0.01 A/m$^2$ and 1 MA/m$^2$, preferably between 0.1 A/m$^2$ and 1 MA/m$^2$, more preferably between 1 A/m$^2$ and 1 MA/m$^2$, still more preferably between 10 A/m$^2$ and 1 MA/m$^2$, most preferably between 100 A/m² and 1 MA/m², with utmost preference between 1000 A/m² and 1 MA/m².

In another preferred embodiment, the carrier is a plate.

The thickness of the plate amounts, particularly for a three-sigma confidence level of 98%, to between 0.01 mm and 20 mm, preferably between 0.05 mm and 15 mm, more preferably between 0.1 mm and 10 mm, still more preferably between 0.5 mm and 5 mm, most preferably between 0.5 mm and 2.5 mm, with utmost preference between 0.5 mm and 2 mm.

In another preferred embodiment, the carrier is a film, particularly a film comprising an organic semiconductor.

The thickness of the film amounts, particularly for a three-sigma confidence level of 98%, to between 0.01 mm and 5 mm, preferably between 0.05 mm and 2.5 mm, more preferably between 0.1 mm and 2 mm, still more preferably between 0.5 mm and 1.5 mm, most preferably between 0.5 mm and 1.25 mm, with utmost preference between 0.5 mm and 1.25 mm.

In another preferred embodiment, the stamp is part of a device which is designed such that the direction of the heat flow generated by the carrier can be directed in a targeted manner During the curing of the embossing compound, the device conveys the heat of the carrier preferably solely in the direction of the embossing compound to be cured. After curing of the embossing compound has taken place, the cooling of the stamp, in particular of the carrier, and/or of the embossing compound is assisted by deflecting the heat flow into the side lying opposite the embossing compound. This deflection is brought about by a change in thermal resistance R. Thermal resistance R is the quotient of the temperature difference ΔT (delta T) and the heat flow dQ/dt, i.e.

$$R_{th} = \frac{\Delta T}{\overset{\cdot}{Q}} = \frac{T_A - T_I}{\frac{\partial Q}{\partial t}}$$

Thermal resistance R is therefore not a pure material parameter, but depends on ambient parameters, in particular external temperature $T_A$. Thermal resistance R can thus be influenced very easily by a suitable cooling system.

The thermal resistance can also be defined by pure material and geometrical parameters.

$$R_{th} = \frac{l}{\lambda A}$$

Here, l and A are the thickness and respectively the cross-section of the (homogeneous) body through which heat flows, in particular the carrier holder, and λ is its thermal conductivity. By means of a relatively small thickness of the carrier holder, the thermal resistance can thus very easily be reduced in a design-related manner.

The device has, in particular at the rear side of the stamp, devices for temperature control, in particular cooling, of the stamp. In a particularly preferred embodiment, the carrier makes contact with a coolable carrier holder. The carrier holder comprises in particular cooling elements, in particular cooling ribs. Peltier elements or recesses, in particular hoses or pipelines, through which a cooling fluid is pumped, would also be conceivable. It is important that a quantity of heat which is absorbed by the carrier holder is removed as efficiently as possible by design measures. The removal preferably takes place with cooling fluids.

In the device, the stamp, in particular a soft stamp and a carrier, and/or the substrate holder and/or the substrate can also be transparent for electromagnetic radiation, in order to combine the use of thermal curing and electromagnetic curing.

The electromagnetic radiation then preferably has a wavelength in the range between 10 nm and 2000 nm, preferably between 50 nm and 1500 nm, more preferably between 100 nm and 1000 nm, most preferably between 150 nm and 500 nm, with utmost preference between 200 nm and 370 nm.

A further aspect of the invention preferred according to the invention is that the soft stamp can be removed from the carrier, in order to provide the carrier with a new, fresh, less worn and less damaged new soft stamp. The soft stamp may be so worn away after a plurality of embossing processes that a replacement is absolutely necessary. In particular, the carrier is cleaned before a soft stamp is newly provided. It is thus possible to use the carrier, which is relatively expensive to produce, repeatedly.

The removal of the soft stamp can take place for example by one of the following methods and/or by a combination of such methods: thermally, for example by a temperature increase above the glass transition temperature, mechanically, physically and/or chemical-physically, for example by ashing with plasma, in particular with $O_2$ plasma, chemically, for example by chemical cleaning with a solvent such as Piranha or solvent mixtures. The complete removal can take place in particular by the combination of chemical dissolution or heat treatment and mechanical action.

In another preferred embodiment, all possible and conceivable semiconductor components can be produced directly in the carrier. It is conceivable for example that, apart from the heating elements according to the invention, microchips for measurement, temperature sensors, bending sensors etc. can be incorporated directly in the carrier, in order to provide the carrier with a plurality of different active and passive components. The carrier thus changes from being a pure structural element into a functional element.

Method

The invention also relates to a method for embossing an embossing compound with the stamp according to the invention and the use of the stamp according to the invention for embossing an embossing compound.

In a first process step according to the invention, a substrate is coated with an embossing compound. The substrate is located on a substrate holder and is preferably fixed by the substrate holder, so that a displacement of the substrate is no longer possible.

In a second process step according to the invention, the stamp is aligned relative to the substrate, in particular using optical aids. The alignment preferably takes place with the aid of alignment marks, which are located on the one hand on the carrier, more preferably on the soft stamp, and on the other hand on the substrate. Very precise positioning of the soft stamp is thus enabled. If the carrier and the soft stamp and/or the substrate and substrate holder are in particular transparent for the electromagnetic radiation used for the alignment, the alignment of the two objects preferably takes place by a so-called face-to-face alignment.

In a third process step according to the invention, embossing of the embossing compound takes place by means of the stamp, in particular by means of the soft stamp. The embossing can either take place in such a way that the soft stamp makes contact with the embossing compound by a relative approach of the substrate and the carrier towards one another and performs the embossing as uniformly as possible. It is also conceivable that a deformation element is used, in order to curve the stamp in a convex manner, in particular concentrically, and thus to press first with its central part into the embossing compound.

During the deformation, the carrier can remain connected to the carrier holder, in particular at the periphery, or can be completely detached from the carrier holder. In particular, reference is made here to the publication WO2015161868. It is also conceivable for the stamp and the embossing compound to be moved closer relative to one another without the stamp being deformed.

In a fourth process step according to the invention, heating of the embossing compound takes place by the embodiment according to the invention. According to the invention, the heat is generated in the heating elements of the carrier, i.e. as close as possible to the embossing compound.

In a fifth process step according to the invention, a deformation of the stamp, in particular of the soft stamp, takes place by the embossing compound.

Further advantages, features and details of the invention emerge from the following description of preferred examples of embodiment and with the aid of the drawings.

BRIEF DESCRIPTION OF THE DRAWINGS

FIG. 3a shows a third embodiment according to the invention in a side view,

FIG. 3b shows the third embodiment according to the invention in a plan view,

FIG. 4 shows a device according to the invention.

Identical components or components with the same function are denoted in the figures with the same reference numbers.

DETAILED DESCRIPTION OF THE INVENTION

Figure 1A:
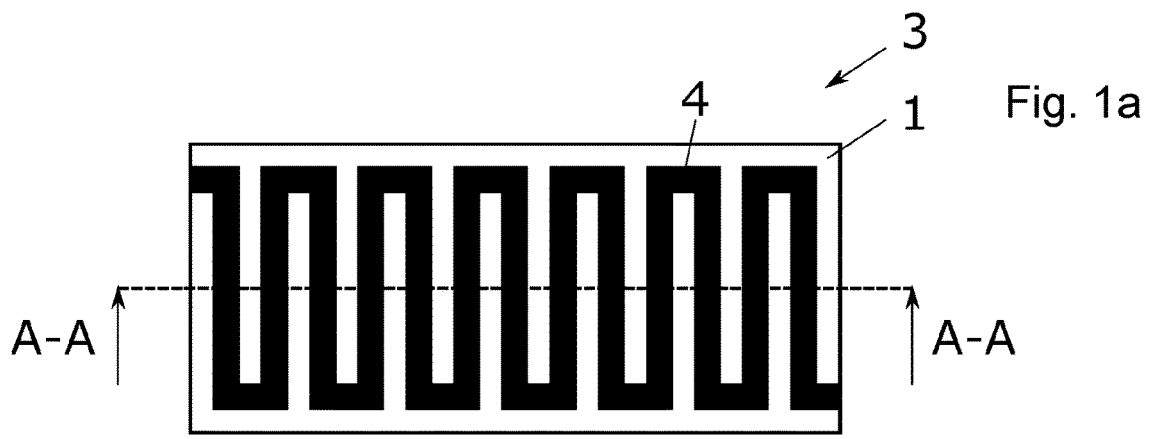
FIG. 1a shows a first embodiment according to the invention in a side view.

FIG. 1a shows a top view of a first embodiment of a stamp 3 according to the invention, comprising a carrier 1 and a soft stamp 2 (not visible in the top view). According to the invention, carrier 1 comprises heating elements 4. Heating elements 4 are represented in FIG. 1a as single, meandering strip conductors. A current flows through the strip conductors. The high current density generates sufficient Joule heat in order thus to carry out to the heating process according to the invention. If carrier 1 is a dielectric, heating elements 4 are preferably produced from a metal. If carrier 1 is a semiconductor material, heating elements 4 can for example be doped, in particular n-doped, regions.

Figure 1B:
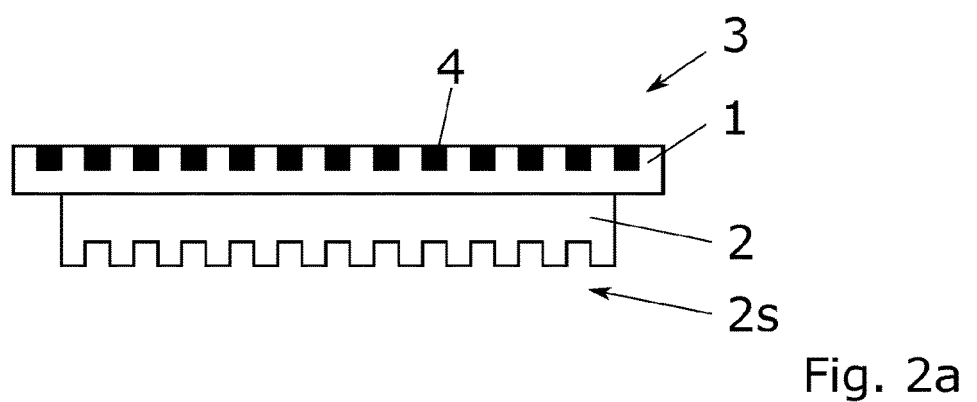
FIG. 1b shows the first embodiment according to the invention in a plan view.

FIG. 1b shows a side view of the first embodiment of a stamp 3 according to the invention, comprising a carrier 1 and a soft stamp 2. The parts of stamp 3 are not represented true to scale in order to improve the representation. In particular, soft stamp structures 2s are a multiple smaller in relation to the total size of soft stamp 2.

Figure 2A:
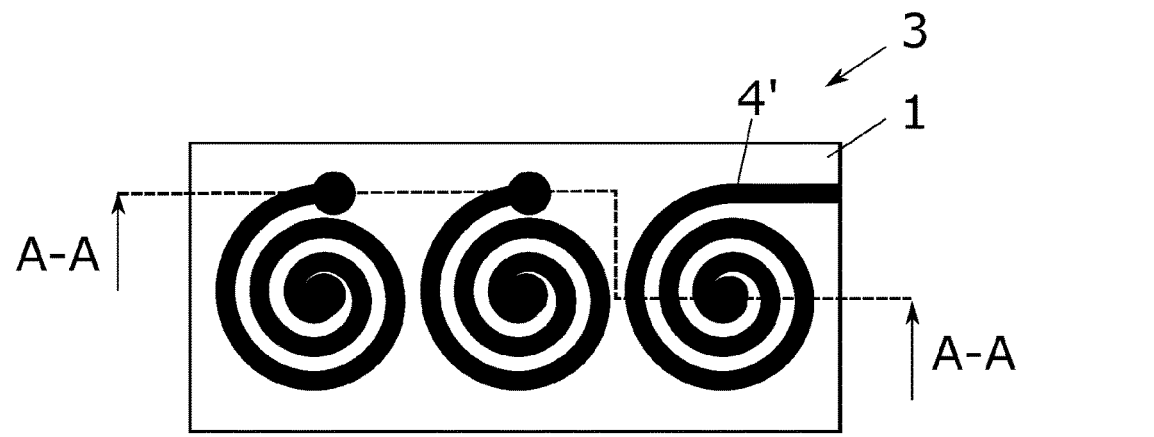
FIG. 2a shows a second embodiment according to the invention in a side view.

FIG. 2a shows a top view a second embodiment of a stamp 3 according to the invention, comprising a carrier 1 and a soft stamp 2. According to the invention, carrier 1 comprises heating elements 4' in a coil form. A current flows through the strip conductors. The high current density generates sufficient Joule heat in order thus to carry out to the heating process according to the invention. According to the invention, however, it is preferable that a high-frequency alternating current flows through coil-shaped heating elements 4' in order to produce a marked temporal change in the magnetic flux.

Figure 2B:
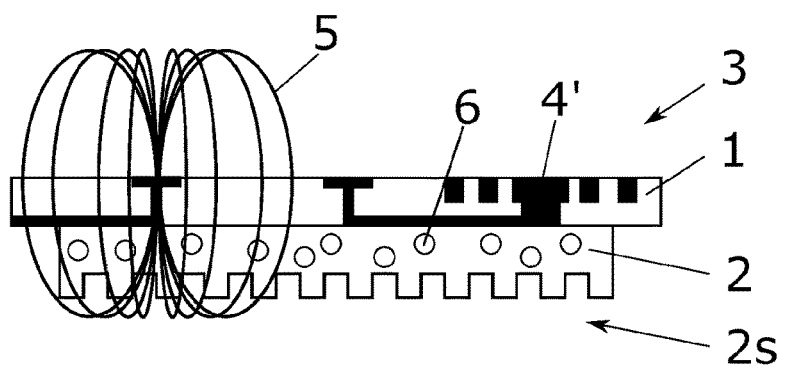
FIG. 2b shows the second embodiment according to the invention in a plan view.

FIG. 2b shows a side view of the second embodiment of a stamp 3 according to the invention, comprising a carrier 1 and a soft stamp 2. Magnetic field lines 5 are represented by way of example for one of coil-shaped heating elements 4'. The representation of magnetic field lines 5 for the two other heating elements 4' is dispensed with for the sake of clarity.

A temporally changing magnetic field induces a voltage in a dielectric through which magnetic field lines 5 run and thus generate a current in the dielectric. This current in turn generates Joule heat. Especially by the so-called skin effect, it is ensured that the currents thus induced are present only at the surface of the dielectric and heat the dielectric correspondingly intensely.

The heating of, in particular metallic, particles 6 which are present in soft stamp 2 is also conceivable. The heating is advantageously brought still closer to soft stamp 2, and therefore to the embossing compound. Heating elements 4' are directly incorporated in carrier 1 and become deformed together with the carrier and adapt thereto.

FIG. 3a shows a top view of a third embodiment of a stamp 3 according to the invention, comprising a carrier 1 and a soft stamp 2. In this special embodiment, entire carrier 1 is conductive and a current flows through the entire area. The (in particular single) heating elements 4" can again be a metal or a doped semiconductor.

FIG. 3b shows a side view of the third embodiment of a stamp 3 according to the invention, comprising a carrier 1 and a soft stamp 2. Heating element 4" extends only over a particularly small thickness t. As a result of small thickness t, it is ensured that the current density and therefore the Joule heat are as high as possible.

FIG. 4 shows a side view of a device, comprising stamp 3, with carrier 1 and soft stamp 2, a carrier holder 10, with fixing elements 11, which fix carrier 1 on carrier holder 10, a deformation element 13 for the deformation of stamp 3, cooling elements 12 for cooling carrier holder 10 and therefore also stamp 3, as well as a substrate holder 9, which accommodates substrate 7 on which embossing compound 8 is deposited. Current source 15 can, depending on the embodiment according to the invention used in each case, either be a direct current source or an alternating current source. Heating elements 4 in carrier 1 are supplied with current by means of current circuit 14.

The inventive idea of incorporating heating elements 4 in carrier 1 is extended by the optional possibility of active and/or passive cooling of stamp 3 by means of carrier holder 10. Especially by the use of active cooling by means of cooling elements 12, preferably ribs, around which a fluid flows, carrier 1 can be cooled again very quickly.

LIST OF REFERENCE NUMBERS 1 carrier
2 soft stamp
2s soft stamp structures
3 stamp
4, 4', 4" heating elements
5 magnetic field lines
6 particles, in particular nanoparticle
7 substrate 8 embossing compound
9 substrate holder
10 carrier holder
11 fixing element
12 cooling element
13 curvature element
14 current circuit
15 current source
t thickness of heating elements

What is claimed is:

1. A stamp comprising:
a soft stamp; and
a deformable carrier on which the soft stamp is detachably embossed and from which the soft stamp is removable via plasma removal, the carrier comprising at least one heating element, the carrier being composed of a semiconductor material and constituted as a plate having a thickness in a range of 0.1 mm and 10 mm.

2. The stamp according to claim 1, wherein the stamp further comprises a temperature-controlled carrier holder.

3. The stamp according to claim 1, wherein the at least one heating element is constituted as a meandering, strip conductor.

4. The stamp according to claim 1, wherein the at least one heating element is constituted as a coil.

5. The stamp according to claim 1, wherein the soft stamp comprises conductive nanoparticles.

6. The stamp according to claim 1, wherein the at least one heating element is constituted as a conductive layer in and/or on the carrier.

7. The stamp according to claim 1, wherein there can be generated in the carrier a current density between 0.01 A/m$^2$ and 1 MA/m$^2$.

8. Use of a stamp according to claim 1 for embossing an embossing compound.

9. The stamp according to claim 3, wherein said meandering, strip conductor is a metallic and/or n-doped region.

10. The stamp according to claim 4, wherein said coil is a flat coil.

11. The stamp according to claim 6, wherein the carrier is at least partially comprised of a conductive material.

12. The stamp according to claim 11, wherein the conductive material is metal.

13. A device comprising:
a stamp comprising:
a soft stamp, and
a deformable carrier on which the soft stamp is detachably embossed and from which the soft stamp is removable via plasma removal, the carrier comprising at least one heating element, the carrier being composed of a semiconductor material and constituted as a plate having a thickness in a range of 0.1 mm and 10 mm; and
a control unit for controlling the at least one heating element.

14. The device according to claim 13, wherein the control unit is a current and/or voltage source.

15. A method for embossing an embossing compound with a stamp, the stamp including a soft stamp and a deformable carrier on which the soft stamp is detachably embossed and from which the soft stamp is removable via plasma removal, the carrier including at least one heating element, the carrier being composed of a semiconductor material and constituted as a plate having a thickness in a range of 0.1 mm and 10 mm, said method comprising:
coating a substrate with the embossing compound;
aligning the stamp relative to the substrate;
embossing the embossing compound by use of the stamp,
heating the embossing compound by use of the at least one heating element of the carrier, and
removing the stamp from the embossing compound.

* * * * *